United States Patent
Sebastien et al.

(10) Patent No.: US 11,925,038 B2
(45) Date of Patent: Mar. 5, 2024

(54) MULTI-JUNCTION PHOTOVOLTAIC DEVICE

(71) Applicant: OXFORD PHOTOVOLTAICS LTD., Yarnton (GB)

(72) Inventors: Thomas Sebastien, Yarnton (GB); James Leslie Best, Yarnton (GB); James Denziel Watts, Yarnton (GB)

(73) Assignee: Oxford Photovoltaics Ltd., Yarnton (GB)

( * ) Notice: Subject to any disclaimer, the term of this patent is extended or adjusted under 35 U.S.C. 154(b) by 0 days.

(21) Appl. No.: 17/626,186

(22) PCT Filed: Jul. 10, 2020

(86) PCT No.: PCT/EP2020/069477
§ 371 (c)(1),
(2) Date: Jan. 11, 2022

(87) PCT Pub. No.: WO2021/005191
PCT Pub. Date: Jan. 14, 2021

(65) Prior Publication Data
US 2022/0278290 A1    Sep. 1, 2022

(30) Foreign Application Priority Data
Jul. 11, 2019  (EP) ..................................... 19185692

(51) Int. Cl.
*H10K 30/10*     (2023.01)
*H10K 30/57*     (2023.01)
(Continued)

(52) U.S. Cl.
CPC ............. *H10K 30/10* (2023.02); *H10K 30/57* (2023.02); *H10K 30/83* (2023.02); *H10K 2102/101* (2023.02)

(58) Field of Classification Search
CPC . H01L 51/4213; H01L 51/445; H01L 27/302; H01L 31/0504; H01L 31/0508;
(Continued)

(56) References Cited

U.S. PATENT DOCUMENTS 4,617,420 A * 10/1986 Dilts ..................... H01L 31/042
438/98
2017/0125619 A1* 5/2017 Nakano ........... H01L 31/022433
(Continued)

FOREIGN PATENT DOCUMENTS

CN       1221224 A    6/1999

OTHER PUBLICATIONS

International Search Report and Written Opinion dated Oct. 5, 2020, from International Application No. PCT/EP2020/069477, 13 pages.
(Continued)

*Primary Examiner* — Devina Pillay
(74) *Attorney, Agent, or Firm* — Meunier Carlin & Curfman LLC

(57) ABSTRACT

A multi-junction photovoltaic device comprises a first sub-cell and a second sub-cell, the second sub-cell overlying the first sub-cell such that incident light passes through the second sub-cell before the first sub-cell. The light-receiving surface of the second sub-cell comprises a layer of a transparent conductive material and one or more metal tracks extending in a first direction and in contact with the layer of transparent conductive material. A layer of electrically insulating material is provided on the light receiving surface of the second sub-cell located under one end of the one or more metal tracks at an edge of the device, and an electrically conductive pad is provided over the layer of electrical insulator and in electrical contact with the one or more metal tracks to provide electrical contact to an external circuit.

13 Claims, 8 Drawing Sheets

(51) Int. Cl.
*H10K 30/83* (2023.01)
*H10K 102/10* (2023.01)

(58) Field of Classification Search
CPC ........ H01L 31/022466; H01L 31/0201; H10K 30/10; H10K 30/57; H10K 30/83; H10K 2102/101
See application file for complete search history.

(56) References Cited

U.S. PATENT DOCUMENTS

| | | |
|---|---|---|
| 2018/0083213 A1 | 3/2018 | Snaith et al. |
| 2018/0158976 A1 | 6/2018 | Ahn |
| 2018/0175112 A1 | 6/2018 | Robinson et al. |
| 2020/0365748 A1 | 11/2020 | Snaith et al. |
| 2022/0005965 A1* | 1/2022 | Uzu ................... H01L 31/0725 |
| 2022/0102659 A1* | 3/2022 | Kamino ................ H01L 31/076 |

OTHER PUBLICATIONS

European Search Report dated Dec. 9, 2019 in EP Application No. 19185692.1, 8 pages.
Reinders et al. "Photovolatic Solar Energy—from Fundamentals to Applications" Wiley 2017 on p. 164 (Book).
Kojima, A. et al., Journal of the American Chemical Society 2009, 131(17), pp. 6050-6051.
Zuo, C. et al., Adv. Sci. 2016, 3, 1500324.
Office Action dated Dec. 21, 2023, in Chinese Patent Application No. 202080059112.8.

* cited by examiner

MULTI-JUNCTION PHOTOVOLTAIC DEVICE

CROSS-REFERENCE TO RELATED APPLICATIONS

This application is a national stage application filed under 35 U.S.C. § 371 of PCT/EP2020/069477 filed Jul. 10, 2020, which claims priority to and benefit of EP application serial number 19185692.1 filed Jul. 11, 2019, which is fully incorporated by reference and made a part hereof.

FIELD OF INVENTION

The present invention relates to photovoltaic (PV) devices, and particularly to multi-junction photovoltaic devices which are monolithically integrated such as tandem solar cells and PV panels.

BACKGROUND OF THE INVENTION

Solar energy conversion is one of the most promising technologies to provide renewable energy. However, the high cost of manufacturing devices that capture solar energy, including high material costs, has historically hindered its widespread use.

Single junction solar cells—such as those made from silicon p-n junctions for example—have a maximum theoretical efficiency of about 29% and practical efficiencies of up to 26% under AM1.5G conditions (see for example the book "Photovoltaic Solar Energy—from Fundamentals to Applications", edited by A Reinders et al., Wiley ISBN9781118927465 [2017] on p. 164). However, if a cell of a material having a higher band gap is stacked on top of the silicon single junction cell (or other type of single junction cell) and connected in series, the limiting theoretical efficiency increases to above 40%. There is therefore much current interest in tandem and other multi-junction cell technologies.

A conventional example of a monolithically integrated multi-junction cell is illustrated in FIGS. 1A (in plan view) and 1B (in cross-section). The device comprises a first sub-cell (1b) and a second sub-cell (1a) in electrical contact with the first sub-cell (1b), wherein the sub-cells are arranged such that incident light passes through the second sub-cell (1a) to reach the first sub-cell (1b) in use. The surface of the second sub-cell has a light receiving surface comprising a layer of a light transmissive conducting material (2) and one or more metal tracks (3) (such as copper strips, for example) in contact with the layer of light transmissive conducting material (2) and extending in a first direction (i.e. parallel to A-A' axis). Typically, an electrically conductive pad (e.g. a metal ribbon) is provided both over the metal track(s) (4) and at the bottom of the device (5), enabling series connection and stringing of multiple devices by electrical connection of the bottom conductive pad of one device with the top conductive pad with the neighbouring device.

However, one problem with the manufacture of photovoltaic modules and panels using multi-junction devices such as that of FIGS. 1A and 1B is short-circuiting through the multi-junction cell when electrical connection is made to the device by adhesive bonding or solder bonding, for example. As a result, device yield and efficiency may be reduced.

The present invention aims to mitigate such disadvantages, and thus make multi-junction PV panel manufacture less expensive and enhance the reliability of photovoltaic panels.

A known method of interconnecting photovoltaic strips with a flexible plastic tape between them is disclosed in U.S. Pat. No. 4,617,420.

SUMMARY OF THE INVENTION

The present invention mitigates these disadvantages with the subject matter of the claims as defined herein. Further advantages of the present invention will be further explained in detail in the section below.

According to a first aspect of the present invention, there is provided a multi-junction photovoltaic device. According to a second aspect of the present invention there is provided a photovoltaic panel comprising a plurality of multijunction devices according to the first aspect connected in series. According to a third aspect of the invention there is provided a method of making a multi- junction photovoltaic device.

Preferred embodiments of the monolithically integrated multi-junction photovoltaic device according to the present invention and other aspects of the present invention are described in the following description and the claims.

BRIEF DESCRIPTION OF THE DRAWINGS

Embodiments of the invention will now be described, by way of example only, with reference to the accompanying schematic drawings, in which.

DETAILED DESCRIPTION OF THE INVENTION

Figure 1A:
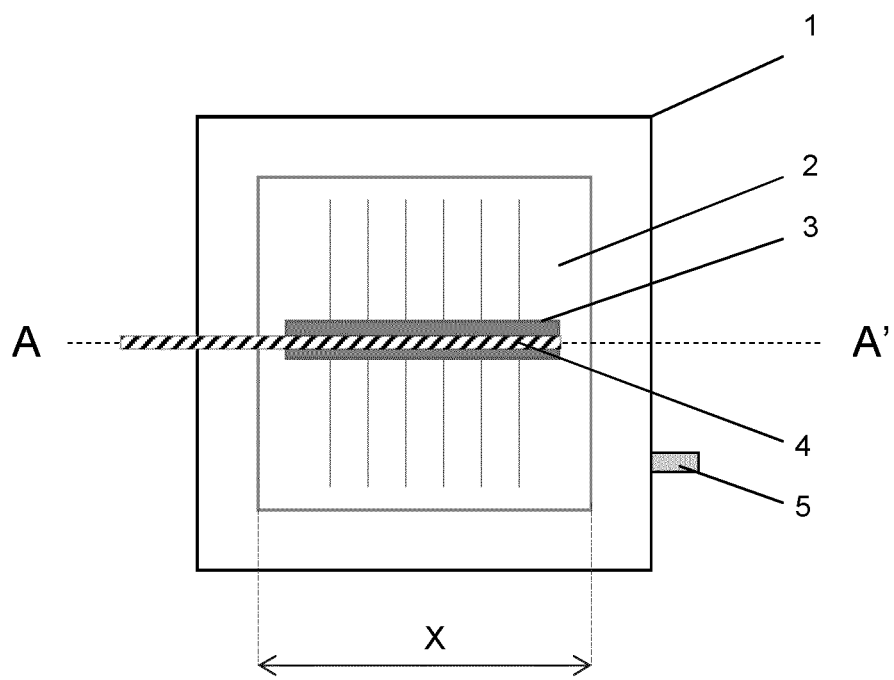
FIG. 1A illustrates the plan view of a known monolithically integrated multi-junction photovoltaic device.

For a more complete understanding of the present invention, reference is now made to the following description of the illustrative embodiments thereof:

Monolithically Integrated Multi-Junction Photovoltaic Device

In a first embodiment, the present invention relates to a monolithically integrated multi-junction photovoltaic device comprising a first sub-cell and a second sub-cell in electrical contact with the first sub-cell, the second sub-cell overlying the first sub-cell and arranged such that incident light passes through the second sub-cell to reach the first sub-cell in use, the surface of the second sub-cell having a light receiving surface comprising a layer of a light transmissive electrically conductive material and one or more metal tracks in contact with the layer of light transmissive electrically conductive material and extending in a first direction, characterised in that a layer of an electrically insulative material is provided on the light receiving surface of the second sub-cell extending under one end of the one or more metal tracks at an edge of the multi-junction cell, and that an electrically conductive pad is provided over the layer of electrically insulative material and in electrical contact with the one or more metal tracks for providing electrical contact to an external circuit.

Advantageously, the absence of light transmissive electrically conductive material and/or the presence of the layer of electrically insulative material on the light receiving surface under the pad significantly reduces the risk of shorting typically observed during application of lamination pressure in subsequent bonding and/or encapsulation.

While the light transmissive electrically conductive material may be below the entire layer of electrically insulative material, it is preferred to leave an edge of the multijunction cell uncoated with light transmissive electrically conductive material so that the electrically insulative material may be provided next to the light transmissive electrically conductive material or only partly overlap the same. In other words, it is preferred that the layer of light transmissive electrically conductive material is not present under the layer of electrically insulative material or that the layer of electrically insulative material overlaps the edge of the layer of light transmissive electrically conductive material on the light receiving surface, so that mechanical and thermal stress at the interface between the electrically conductive pad and the metal track is spaced apart from the tandem active area.

Light transmissive electrically conductive materials for use in the present invention are preferably materials with an optical transmission measured between wavelengths of 250 nm and 750 nm of 50% to 90% or 95%, further preferably at least 80%, and a resistivity of $10^{-2}$ $\Omega\cdot$cm or lower (according to ASTM B193-16).

Materials typically used are transparent conductive oxides (TCO) such as $SnO_2$ doped with Sb or F (ATO or FTO), ZnO doped with Al (AZO) or Ga, and $In_2O_3$ doped with Sn (ITO), for example. Alternatively, carbon nanotubes, silver nanowires or graphene films may also be used. The thickness of the light transmissive electrically conductive material layer may be appropriately selected by the skilled artisan depending on the used material. For example, if transparent conductive oxides are used as light transmissive conductive materials, typical thicknesses range from 50 to 200 nm.

While the electrically insulative material for use in the present invention is not particularly limited, materials with a volume resistivity above $10^{10}$ $\Omega\cdot$cm (which may be determined according to ASTM D257, for example) and a thermal expansion coefficient of between 1 and 100 ppm/K (according to thermomechanical analysis) are preferred.

In a preferred embodiment, the electrically insulative material is light transmissive, i.e. exhibits an average transmission for visible light of at least 90%, which potentially enables extension of the tandem active area in the case where light transmissive electrically conductive material is present under the layer of electrically insulative material.

In an especially preferred embodiment, the electrically insulative material is one or more of silicon oxide, silicon oxynitride, silicon nitride, alumina and a cross-linked polymer (including, but not limited to epoxy-based polymers, silicone-based polymers, polyimides, acrylate-based polymers and co-polymers thereof, for example). In a particularly preferred embodiment from the viewpoint of simple manufacture, the electrically insulative material comprises a photo-crosslinked polymer. The thickness of the electrically insulative material layer is not particularly limited, but typically ranges between 0.5 and 300 µm, preferably between 1 and 100 µm. The electrically insulative material is preferably resilient, so that when arranged in a shingled arrangement in a module the module can more easily withstand mechanical shocks or temperature gradients causing shear forces due to differential expansion.

The one or more metal tracks in contact with the layer of light transmissive electrically conductive material are typically ribbons or deposited layers which typically comprise or consist of one or more highly electrically conductive metals (such as copper, silver or aluminum) or metal alloys. In a preferred embodiment, the one or more metal tracks are formed by deposition of a metallisation paste (e.g. silver paste with an Ag loading of 70 to 95%) and subsequent drying. Typical dimensions of a metal track range between 10 and 100 µm, preferably between 25 and 60 µm in width, and between 1 and 30 µm, preferably between 5 and 17 µm in height.

In the monolithically integrated multi-junction photovoltaic device according to the present invention, an electrically conductive pad is provided over the layer of electrically insulative material and in electrical contact with the one or more metal tracks for providing electrical contact to an external circuit. For this purpose, the electrically conductive pad may extend beyond the surface of the electrically insulative material layer and/or the top surface of the multi junction device. The material used for the electrically conductive pad is not particularly limited as long as it exhibits a low resistivity (preferably a resistivity of $10^{-1}$ $\Omega\cdot$cm or less, further preferably $10^{-2}$ $\Omega\cdot$cm or less) and enables bonding for stringing applications. While not being limited thereto, preferred materials include solders (e.g. metals or metal alloys, such as Sn/Pb 60/40, Sn/Pb/Ag 62/36/2 or Sn/Ag 96.5/3.5 alloys for example) to which a flux can be added to prevent oxidation. Alternatively, when low-temperature processes are desirable (e.g., when using perovskite formulations sensitive to heat) it is preferable to use electrically conductive adhesives, further preferably isotropic or anisotropic conductive adhesives (pastes or tapes) with resistivities between $0.5\cdot10^{-4}$ and $50\cdot10^{-4}$ $\Omega\cdot$cm through the thickness or z axis, ideally allowing to achieve peel strengths above 1 N/mm. As exemplary electrically conductive adhesives, cross-linkable polymers (such as epoxies, silicones or acrylates) loaded with conductive particles (e.g. metal particles) may be mentioned. The thickness of the electrically conductive pad may be suitably chosen by the skilled artisan depending on the material, geometry and desired bond properties. For instance, typical solder thicknesses range from 5 to 100 µm, preferably 10 to 50 µm. Typical thicknesses of pads made of electrically conductive adhesives range between 20 and 300 μm, preferably between 30 and 200 μm.

The term "electrically conductive pad" herein can refer to a pad on the metal track (for the shingle stringing arrangement) or to a metal ribbon attached to the the metal track (for the conventional stringing arrangement). Therefore, examples of "electrically conductive pads" may include: a). a metal ribbon bonded (to the metal track) with electrically conductive adhesive (for conventional stringing); b). a metal ribbon bonded (to the metal track) with solder (for conventional stringing); c). an electrically conductive adhesive pad only (for shingling); and d). a solder pad only (for shingling).

In general, it is understood that the specific configurations of the first and second sub-cells are not particularly limited and each of them may comprise multiple sub-layers as well as one or more intermediate layers provided between the first and second sub-cell.

Exemplary intermediate layers include interconnect layers, which may comprise transparent conductive oxides (incl. indium tin oxide (ITO) or aluminium doped zinc oxide (AZO), or the like), carbons (e.g. graphene), and metal nanowires, for example. Preferably the interconnect layer of ITO has a thickness of from 10 nm to 60 nm, and more preferably a thickness of approximately 30 to 55 nm.

In a preferred embodiment, the second sub-cell comprises a layer of a perovskite material.

The term "perovskite", as used herein, refers to a material with a three-dimensional crystal structure related to that of $CaTiO_3$ or a material comprising a layer of material, which layer has a structure related to that of $CaTiO_3$, the former being preferred. As will be known by the skilled artisan, perovskites can be represented in a general manner by the formula $ABX_3$, wherein A and B are cations of different sizes and X is an anion or by the formula $[A][B][X]_3$, wherein [A] is at least one cation, [B] is at least one cation and [X] is an anion. A preferred perovskite material is a photosensitizing material, i.e. a material which is capable of performing both photogeneration and charge transportation. In a further preferred embodiment, the perovskite material comprises one or more cations selected from organic cations and caesium or rubidium cations, one or more of Pb, Sn, or Ti, and one or more halide anions selected from Cl, Br and I.

The perovskite material may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material. While not being limited thereto, exemplary perovskite materials which may be used are disclosed in Kojima, A. et al., Journal of the American Chemical Society 2009, 131(17), pp. 6050-1; Zuo, C. et al., Adv. Sci. 2016, 3, 1500324; WO 2013/171517 A1; WO 2014/045021 A1; and WO 2016/198898 A1, for example.

If the second sub-cell comprises a perovskite material, a layer comprising perovskite material is preferably sandwiched between an n-type region comprising at least one n-type layer and a p-type region comprising at least one p-type layer thus providing a p-i-n or n-i-p sub-cell architecture.

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron-transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials known in the art. An electron-transporting compound or elemental material may be undoped or doped with one or more dopant elements. While not being limited thereto, exemplary n-type materials may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. As examples thereof, n-type materials selected from an oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals may be mentioned. As an alternative a C60 or C70 fullerene or fullerene derivative material such as PCBM, ICBA, IPB or IPH can be used to form the n-type region.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole-transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials known in the art. A hole-transporting compound or elemental material may be undoped or doped with one or more dopant elements. Exemplary p-type compounds include, but are not limited to spiro-OMeTAD (2,2',7,7'-tetrakis-(N,N-di-p-methoxyphenylamine)9,9'-spirobifluorene)), TNATA (4,4',4''-tris-(N-(naphthylen-2-yl)-N-phenylamine)triphenylamine), BPAPF (9,9-bis[4-(N,N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N-diphenylamino)-tetraphenyl), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide), tBP(tert-butylpyridine) m-MTDATA (4,4',4"-tris(methylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N, N'-diphenyl]-1,1'-biphenyl)-4,4'-diamine), a-NPB (N, N'-di(naphthalen-1-yl)-N,N'-diphenyl-benzidine), and PEDOT:PSS. The p-type layer may further include dopants, such as tertbutyl pyridine, LiTFSI or nitrosonium tetrafluoroborate, for example.

The p-type layer may further comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, each which may be doped or undoped.

In another preferred embodiment, the first sub-cell has a smaller bandgap than the second sub-cell. Further preferably, the first sub-cell comprises a monocrystalline silicon, polysilicon, CdTe, $Cu(In,Ga)Se_2$ or $Cu_2ZnSn(S,Se)_4$ sub-cell, or a perovskite sub-cell (the bandgap of which is smaller than that of the second sub-cell).

In order to optimise harvesting of the solar spectrum, the second sub-cell preferably comprises a perovskite material having a band gap from 1.50 eV to 1.75 eV, and more preferably from 1.65 eV to 1.70 eV, and the first sub-cell preferably has a band gap of between 1.05 eV to 1.15 eV, more preferably around 1.1 eV. The term "band gap", as used herein, refers to the energy difference between the top of the valence band and the bottom of the conduction band in a material, which may be determined by a skilled artisan without undue experimentation.

It is noted that the monolithically integrated multi-junction photovoltaic device may include more than two sub-cells as long as the individual sub-cells are electrically connected in series between a single pair of terminals (i.e. electrically conductive pads). Examples of triple sub-cell structures include, but are not limited to bifacial monolithically integrated multi-junction photovoltaic devices comprising a top sub-cell (second sub-cell) that comprises a photoactive region containing a perovskite material, a middle sub-cell (first sub-cell) comprising a silicon heterojunction (SHJ), and a bottom sub-cell that comprises a photoactive region containing a perovskite material.

Figure 2A:
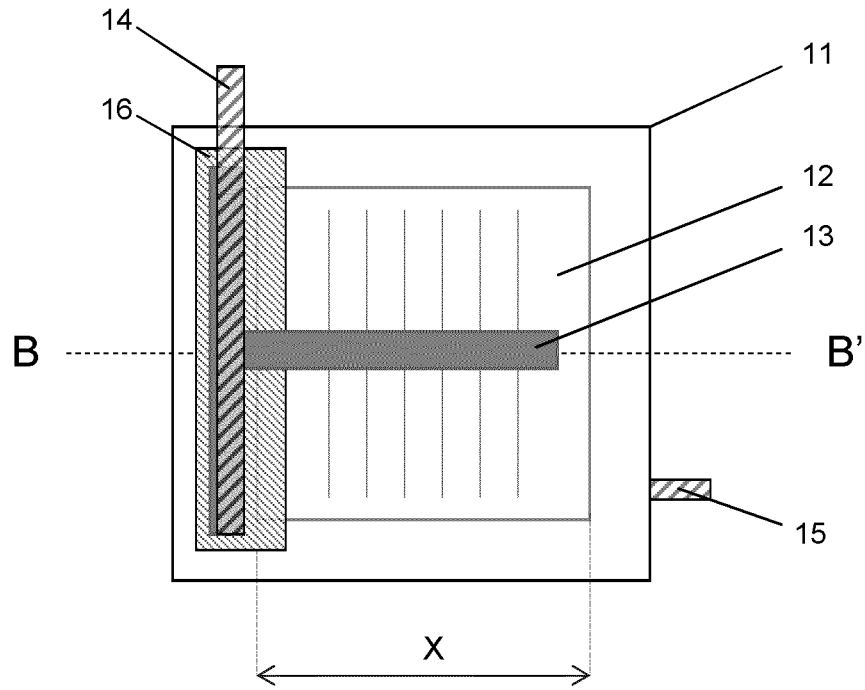
FIG. 2A shows schematically the plan view of a first embodiment of a device according to the present invention.
Figure 2B:
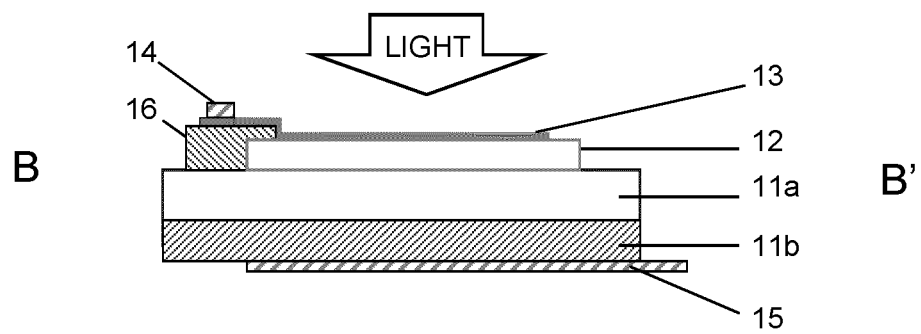
FIG. 2B shows schematically a cross-section of the first embodiment of a device according to the present invention.

An example of a monolithically integrated multi-junction photovoltaic device is shown in FIGS. 2A and 2B, illustrating a monolithically integrated structure comprising a first sub-cell (11b), overlaid by a second sub-cell (11a). On top of the second sub-cell (11a), i.e. on the light receiving surface side, a layer of a light transmissive electrically conductive material (12) is provided on a part of the light receiving surface (as shown in FIGS. 2A and 2B). Alternatively, the light transmissive conductive material (12) may be provided over the entire light-receiving surface (not shown). The multi-junction cell (11) further comprises an electrically insulative material (16) at an edge thereof. In addition, at least one metal track (13) is provided in contact with the layer of light transmissive electrically conductive material (12) and extending in a first direction (i.e. parallel to the B-B' axis), with one end of the metal track (13) being placed above the electrically insulative material (16). In a preferred embodiment, the monolithically integrated multi-junction photovoltaic device comprises a plurality of metal tracks being spaced apart from each other and extending in the first direction (not shown in FIGS. 2A and 2B). While not being limited thereto, the electrically insulative material (16) extends in a direction perpendicular to the first direction (i.e. the B-B' axis) and plane-parallel with the light-receiving surface, as is shown in FIG. 2A. Finally, an electrically conductive pad (14) is provided over the layer of electrically insulative material (16) and in electrical contact with the metal track (13) for providing electrical contact to an external circuit. Optionally, a second electrically conductive pad (15) may be provided on the bottom surface of the multi-junction cell.

Figure 1B:
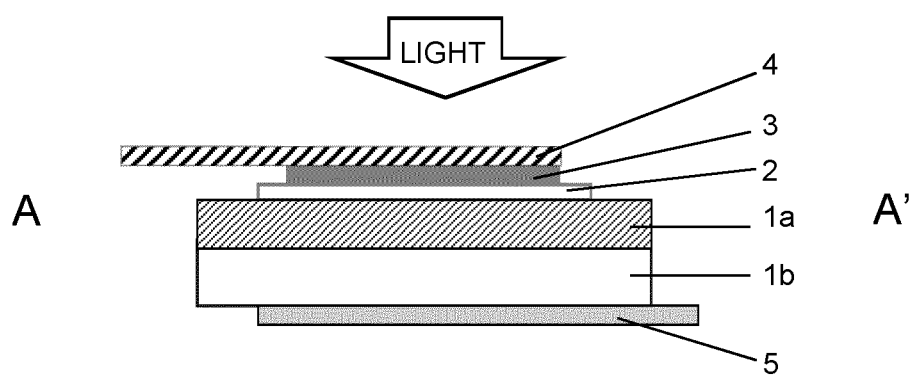
FIG. 1B illustrates the known monolithically integrated multi-junction photovoltaic device in cross-section.

In the conventional device of FIGS. 1A and 1B, the region where the conductive pad (4) is bonded to the metal track (3) is directly above the light transmissive electrically conductive material (2), with the metal track (3) being in direct contact therewith. Thus, bonding processes involving high temperatures must be avoided to prevent damage of the light-receiving surface, which severely restricts the choice of bonding techniques and the quality of the resulting bonds. In contrast, in the present invention, as illustrated in FIGS. 2A and 2B, the electrically insulative material (16) is provided below the metal track (13) at the portion where the electrically conductive pad (14) is bonded and therefore serves as a thermal buffer. Hence, a wide range of techniques may be employed for bonding of the electrically conductive pad (14) to the metal track (13), including soldering methods at elevated temperatures (up to 300° C. or higher). A further advantage is that during aging, the thermal stress (shear) at the interface between the electrically conductive pad (14) and the metal track (13) is remote from the tandem active area. Therefore, the monolithically integrated multi-junction photovoltaic device according to the present invention exhibits improved performance and reliability.

Photovoltaic Panels

In a second embodiment, the present invention relates to a photovoltaic panel comprising a plurality of multi-junction photovoltaic devices according to the first embodiment described above, arranged in rows on a substrate and electrically connected in series with one another via said electrically conductive pads.

Figure 3A:
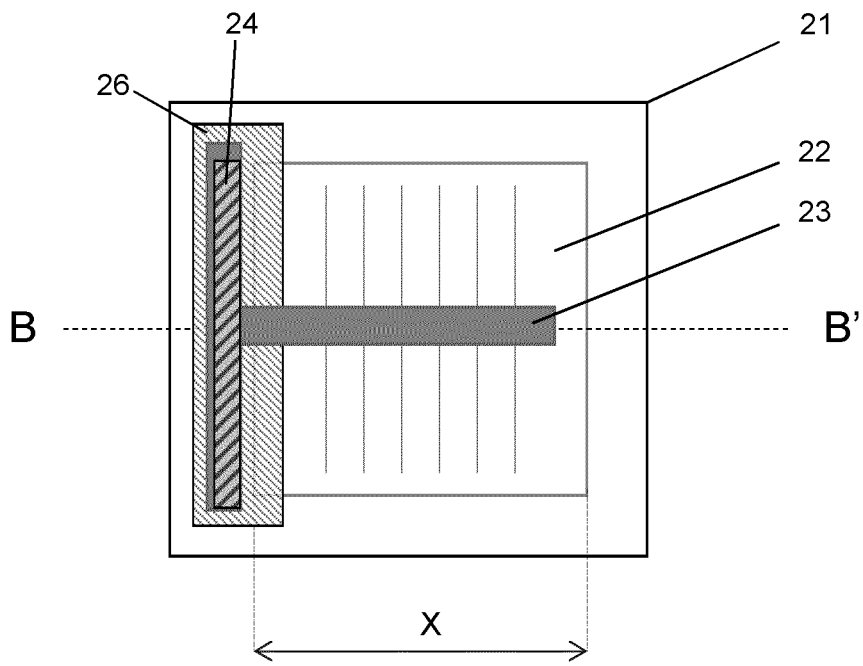
FIG. 3A shows schematically the plan view of a second embodiment of a device according to the present invention.
Figure 3B:
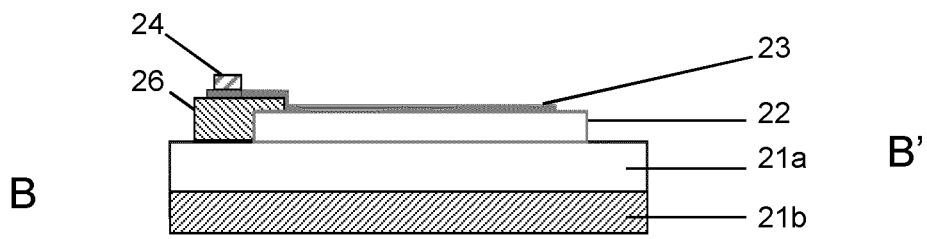
FIG. 3B shows schematically a cross-section of the device according to FIG. 3A.
Figure 3C:
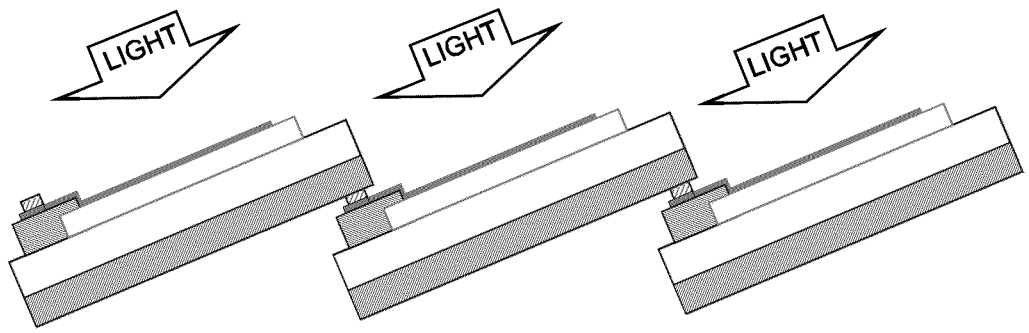
FIG. 3C illustrates a cross section of a "shingled" photovoltaic panel having a plurality of devices connected electrically in series in an overlapping row according to an example of the second embodiment of the present invention.

In a preferred embodiment, the multi-junction photovoltaic devices are arranged in overlapping rows such that the pad on one device is in contact with the rear contact of an adjacent device. For example, by using a configuration according to FIGS. 2A and 2B, pad contact may be established by bonding the lower electrically conductive bond pad (15) of one device to the upper electrically conductive bond pad (14) of a neighbouring device. An alternatively preferred embodiment is illustrated in FIGS. 3A to 3C. Herein, the lower electrically conductive bond pad is omitted. A plurality of multi-junction photovoltaic devices according to FIGS. 3A and 3B may then directly connected to each other, preferably using an electrically conductive adhesive for the electrically conductive pad, in such a way that the back side of the upper cell is in contact with the electrically conductive pad (24) of the front side of the lower cell (see FIG. 3C), thereby providing a shingled configuration. The maximal overlap between two connected cells is preferably limited to the width of the strip of insulating material.

One or more glass substrates and/or transparent polymer substrates may be used to cover the rear and the front of the photovoltaic panel. In addition, the photovoltaic panel may be sealed (e.g. at the corner portions) using encapsulating material and/or sealing members known in the art. Depending on the application, the photovoltaic panel may be optionally provided with a mounting member (e.g. mounting plate or similar) and/or a height/angle adjustment support.

Manufacturing Methods of Monolithically Integrated Multi-Junction Photovoltaic Devices In a third embodiment, the present invention relates to a method of making a monolithically integrated photovoltaic device, the method comprising: (a) providing a first photovoltaic sub-cell; (b) providing a second sub cell on top of and in electrical contact with the first sub-cell, the light receiving surface of the second sub-cell comprising a layer of a light transmissive electrically conductive material on the majority of the top surface of the second sub-cell; (c) providing a layer of an electrically insulative material on a minority (preferably one edge region) of the top surface of the second sub-cell; (d) providing elongate electrical contacts on the light receiving surface, which contacts extend over both the layer of light transmissive electrically conductive material and the layer of electrically insulative material; and (e) providing an electrically conductive pad on top of the layer of electrically insulative material and in electrical contact with the elongate electrical contacts for providing electrical contact to an external circuit.

In this respect, the term "majority" indicates 50% or more, preferably 60% or more, especially preferably 70% or more of the surface, particularly preferably between 80 and 98%, whereas the term "minority" indicates less than 50%, preferably less than 40%, especially preferably less than 30% of the surface, particularly preferably between 2 and 20%. In preferred embodiments, step (b) is performed so that a region (particularly preferably an edge region) of the light receiving surface does not have a layer of a light transmissive electrically conductive material. In a further preferred embodiment, the layer of electrically insulative material is provided in step (c) on said region of the light receiving surface which does not have a layer of a light transmissive electrically conductive material.

In this respect, it may be preferred that in step (c), the layer of electrically insulative material is arranged to overlap the edge of the layer of light transmissive electrically conductive material.

While not being limited thereto and being mainly dependent on the type and structure of the first and second sub-cells, steps (a) and/or (b) are preferably performed by vacuum deposition or solution coating.

For example, in case of a 2-terminal Si/perovskite tandem cell (employing n-i-p or p-i-n cell architecture), step (a) may comprise the provision of a silicon solar cell with no front metallisation grid, and step (b) may comprise the steps of: (b1) providing an n-type (or p-type) contact material uniformly on top of a silicon solar cell (e.g. by vacuum deposition or solution coating), (b2) direct or multi-step deposition (e.g., via vacuum deposition or solution coating) of the perovskite photovoltaic absorber on top of the n-type (or p-type) contact material; and (b3) providing a p-type (or n-type) contact material uniformly on top of a silicon solar cell (e.g. by vacuum deposition or solution coating) stack of sub-cells.

Figure 4A:
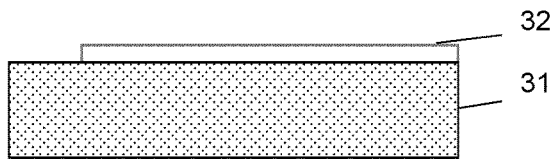
FIGS. 4A, 4B, 4C and 4E illustrate an exemplary sequence of preparing a monolithically integrated multi-junction photovoltaic device according to the present invention, with FIGS. 4D and 4F showing the plan view of the illustrations of FIGS. 4C and 4E, respectively.

While not being limited thereto, a preferred embodiment of the following steps is illustrated in FIGS. 4A to 4F. Herein, a layer of light-transmissive conductive material (32) is provided on top of the stack of sub-cells (30) with a pattern leaving one narrow strip of the contact material uncoated at one of the edges of the wafer (e.g., by vacuum deposition or solution coating). If vacuum deposition is employed, such a pattern may be made by using a shadow mask. If solution coating is employed, a photolithography step may be needed to mask the p-type contact material where the transparent conductive material should not be deposited (this is in the case of n-i-p structures where the p type material is deposited on top—if a p-i-n configuration is desired then the mask will be on the n-type material). A photoresist etching step may then be required (lift-off process). Alternatively, the transparent conductive material may be deposited uniformly on the entire top surface of stack of sub-cells (not shown), although the embodiment shown in FIG. 4A is preferable.

Suitable materials for light-transmissive conductive materials are mentioned above with respect to the first embodiment. If transparent conductive oxides are used, sputtering and chemical vapour deposition are appropriate deposition methods. If sputtering is chosen, this can be done with metal targets using reactive gases or with metal oxide targets using RF power supplies, for example.

Figure 4B:
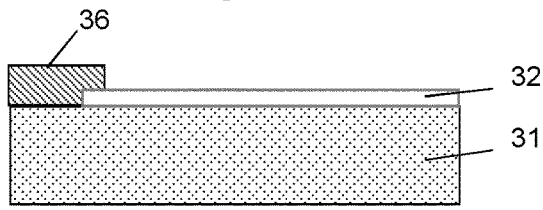

Thereafter, an electrically insulative material (36) is deposited on top of the edge of the cell previously patterned, preferably in such a way that there is a small overlap between the insulating material (36) and the light-transmissive conductive material (32) (see FIG. 4B).

Suitable methods for this step include screen-printing, for example. As electrically insulative materials, inorganic thin films such as $SiO_2$ or $Al_2O_3$ layers may be deposited via vacuum deposition methods, for example. If cross-linkable (thermally or UV-curable) polymers such as epoxides, acrylates or polyimides are used as electrically insulative material, these may be deposited via printing (e.g., screen-printing or inkjet printing) or dispense (e.g. pneumatic dispense) methods, for example, and subsequently cured (by heating, typically at a temperature range of 100 to 200° C., or by UV-irradiation) as required.

Figure 4C:
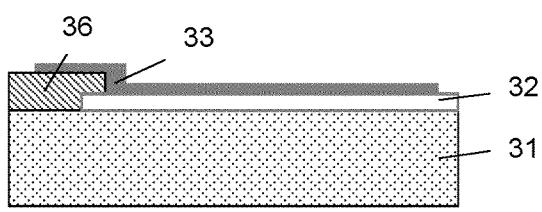
Figure 4D:
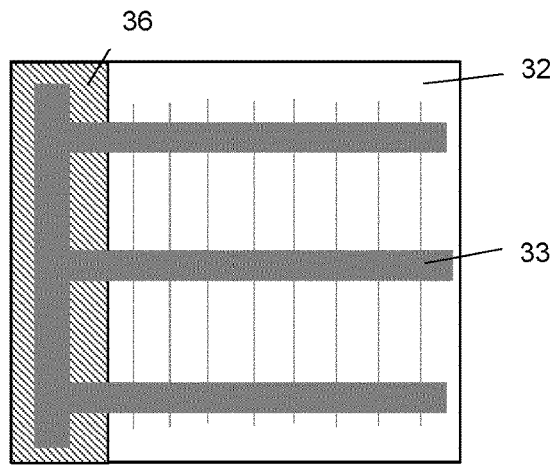

Subsequently, the metal tracks (33) may be deposited on top the cell, e.g., via screen-printing or a plating method (see FIGS. 4C and 4D). As indicated above, exemplary materials used for the metal tracks may be metal-loaded pastes, which may further require a drying step between 150 and 400° F. For compositions sensitive to heat, it is recommended to select metallisation pastes with lower drying temperatures.

Figure 4E:
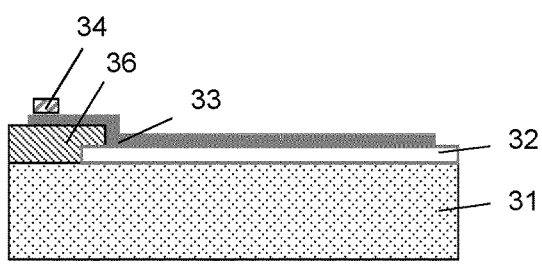
Figure 4F:
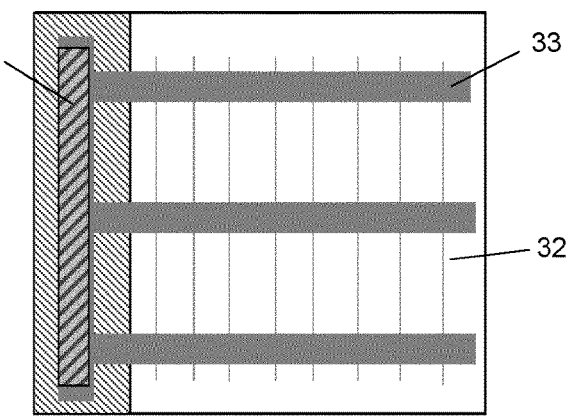

Thereafter, as illustrated in FIGS. 4E and 4F, an electrically conductive pad (34) is provided in contact with the metal tracks (33). Alternatively, electrically conductive adhesives can be used for shingling technologies, and also for conventional stringing technologies when low-temperature processes are recommended (for example when using perovskite compositions sensitive to heat). If the electrically conductive pad (34) is made with cross-linkable polymers, such as epoxies, silicones or acrylates, loaded with metal particles for example, a curing step is usually required. Typical curing temperatures range between 100 and 200° C. In some embodiments, the curing of the electrically conductive adhesive can be achieved during the module lamination step at a temperature between 140 and 160° C. (e.g. in shingled arrangements). As discussed above with respect to the first embodiment, a further electrically conductive pad may be provided at the bottom of the device (not shown in FIGS. 4E and 4F), which may be made of metals, metal alloys (via screen-printing or a plating method, for example) or electrically conductive adhesives, for example.

The cell is then ready for top and bottom contacting for stringing (conventional with ribbons or shingling for example). If using a conventional stringing method (=using conductive ribbons) and electrically conductive adhesive, the electrically conductive adhesive may be applied on the cell or on the ribbon using a pneumatic dispense method, for example. In addition, the conductive ribbons can be attached to the metal tracks and to the back of the cell using soldering techniques or using an electrically conductive adhesive (which may require automated pneumatic dispense and thermal cure). The soldering and dispense of the electrically conductive adhesive on top of the front conductive fingers should be limited to the area coated with the insulating material. For a stringing method using soldering as contacting method (e.g. when metals or metal alloys are used for both top and bottom electrically conductive pads), the ribbons may be supplied already coated with solder. When shingling, the maximal overlap between two connected cells should be limited to the width of the strip of insulating material to avoid losses in device efficiency.

It will be understood that the preferred features of each embodiment may be freely combined in any combination, except for combinations where at least some of the features are mutually exclusive.

EXAMPLES

Comparative Example 1

Figure 5:
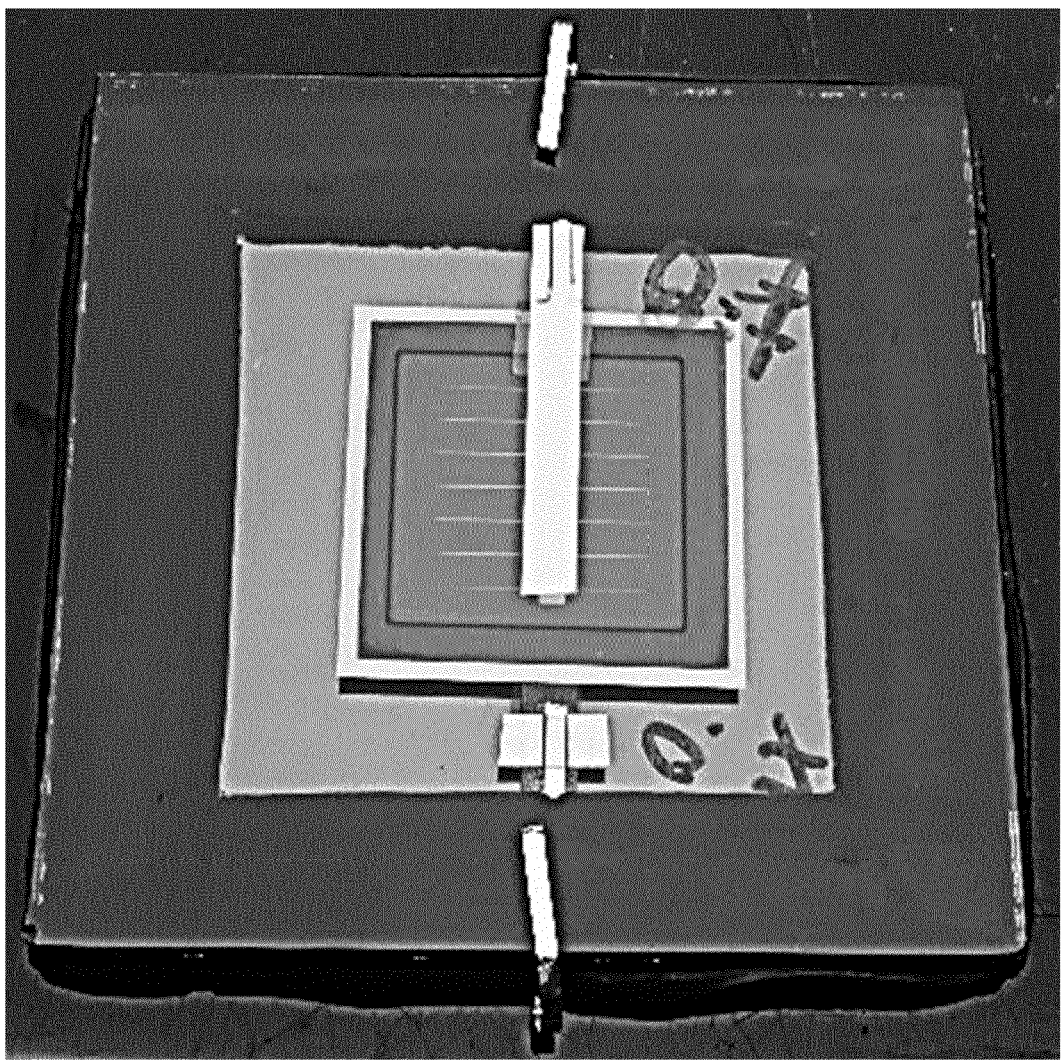
FIG. 5 is a photograph of the monolithically integrated multi-junction photovoltaic device of Comparative Example 1.
Figure 6:
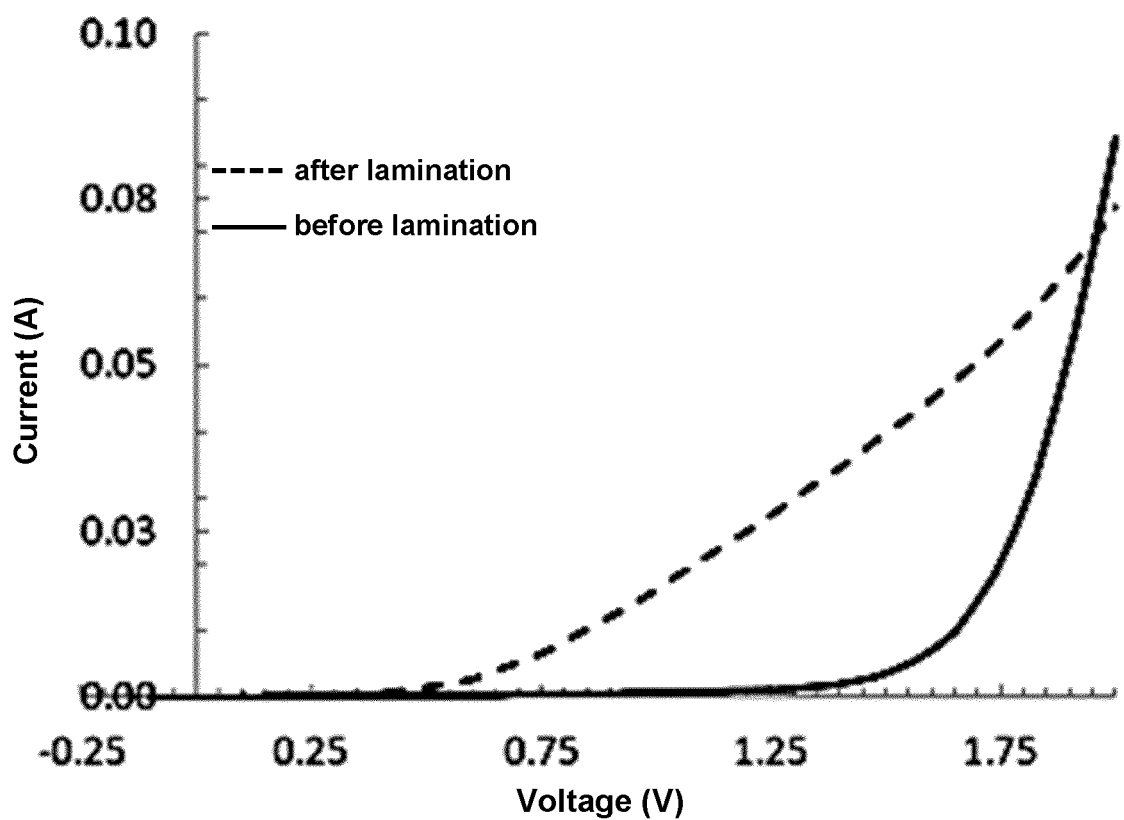
FIG. 6 shows current-voltage characteristics for the device of Comparative Example 1 before and after bonding and lamination/encapsulation.

In Comparative Example 1, a 2-terminal Si/perovskite tandem cell with conventional design (according to FIGS. 1A and 1B) comprising Ag metal track was provided. On the tandem cell, top electrically conductive pads were provided by using a silver paste to deposit 10 μm thick fingers (i.e. a 10 μm thick layer) via screen-printing over the central metal track, and by drying the paste in an infrared dryer at 170° C. for 20 min. In addition, bottom electrically conductive pads were provided in the same manner on the bottom surface of the silicon sub-cell. Two wires were used to contact the top and bottom electrically conductive pads and the device was then encapsulated. A photograph of a resulting monolithically integrated cell is shown in FIG. 5. The current-voltage characteristics of the device was measured before and after lamination of the monolithically integrated pairs of cells. As is indicated in FIG. 6, a short circuit is observed at the top cell upon lamination.

Comparative Example 2

Figure 7A:
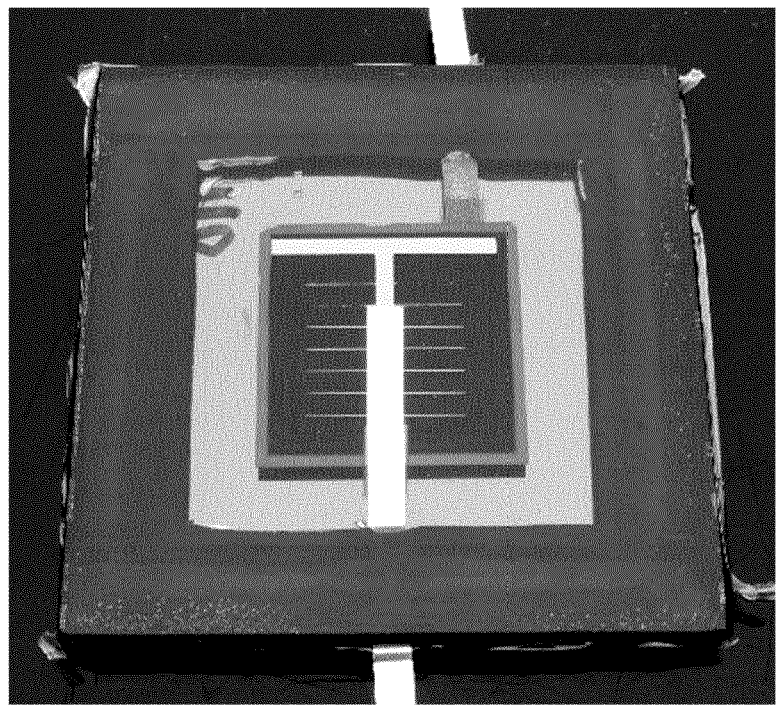
FIG. 7A is a photograph of the monolithically integrated multi-junction photovoltaic device of Comparative Example 2.

In Comparative Example 2, the same 2-terminal Si/perovskite tandem cells were employed as in Comparative Example 1, with the exception that electrically insulating material in the form of a 25 μm thick, UV-cured epoxy film was provided (cf. under the horizontal line of the T-shape of the photograph of FIG. 7A) and the Ag metal tracks were extended to go on top of the insulating material. The electrically insulating material was deposited via screen-printing using a screen with mesh size of 380-460 tpi, at a print speed of 45 mm/s, a squeegee pressure 3 kg (45° angle) and a 0.7 mm print gap. After printing, a UV conveyor curer was used to expose the cell to a UV dose between 500-1000 mJ/cm$^2$, using a UV-LED lamp at 395 nm wavelength. Top electrically conductive pads were provided by using a silver paste to deposit a 10 μm thick layer via screen-printing over the metal track in the area not covered by the insulating material (cf. FIG. 7A), and by drying the paste in an infrared dryer at 170° C. for 20 min. In addition, bottom electrically conductive pads were provided in the same manner on the bottom surface of the silicon sub-cell. Two wires were used to to contact the top and bottom electrically conductive pads and the device was encapsulated. The current-voltage characteristics of the device was measured after lamination.

Example 1

Figure 7B:
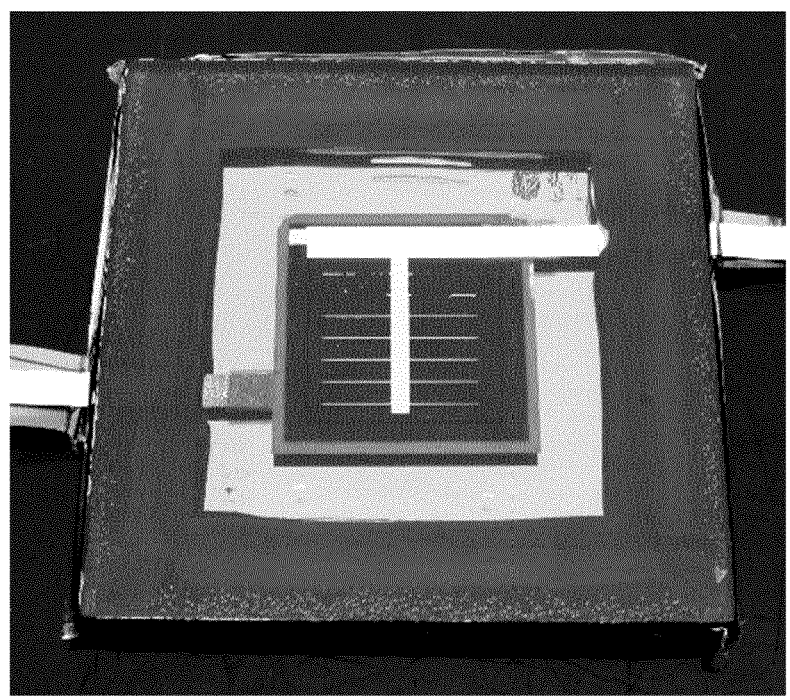
FIG. 7B is a photograph of the monolithically integrated multi-junction photovoltaic device of Example 1 according to the present invention.

In Example 1, the same 2-terminal Si/perovskite tandem cells were employed as in Comparative Example 2, with the exception that the top electrically conductive pads were provided over the electrically insulating layer (see FIG. 7B), in line with FIGS. 2A and 2B. Two wires were used to contact the top and bottom electrically conductive pads and the device was then encapsulated. The current-voltage characteristics of the device was measured after lamination.

Figure 8:
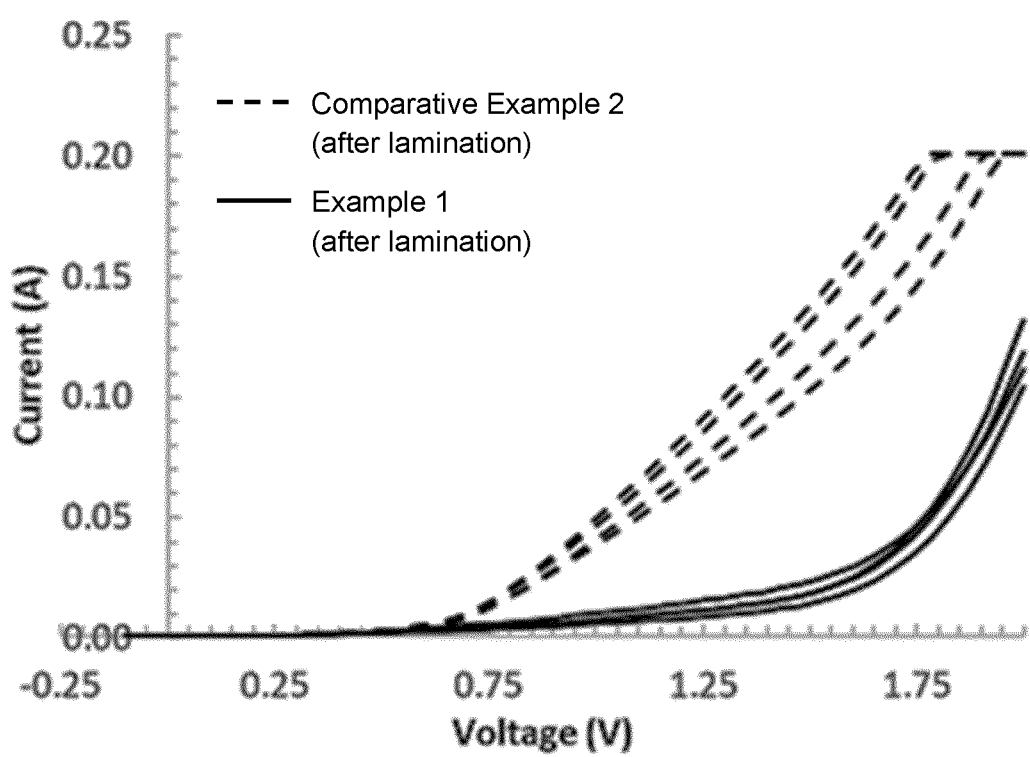
FIG. 8 shows current-voltage characteristics for the devices of Comparative Example 2 and Example 1 after bonding and lamination/encapsulation.

The current-voltage characteristics of Comparative Example 2 and Example 1 are shown in FIG. 8. As may be taken from the profile of Comparative Example 2, a short circuit is observed, resulting in similar C-V characteristics as Comparative Example 1.

On the other hand, in Example 1 the short-circuit created during lamination under the top ribbon was successfully eliminated by providing the top electrically conductive pad over the electrically insulating layer.

These results indicate that the monolithically integrated multi-junction photovoltaic devices according to the present invention enable provision of photovoltaic panels with improved performance and reliability.

Once given the above disclosure, many other features, modifications, and improvements will become apparent to the skilled artisan.

The tandem cells may be connected together by stringing or shingling in panels comprising an array of tandem cells.

REFERENCE NUMERALS

1/11/21/31: Monolithically integrated multijunction photovoltaic device
1a/11a/21a: second sub-cell
2b/12b/22b: first sub-cell
2/12/22/32: light-transmissive conductive material
3/13/23/33: metal track(s)
4/14/24/34: top electrically conductive pad
5/15: optional bottom electrically conductive pad
16/26/36: electrically insulative material
30: stack of sub-cells
X: width of tandem active area

The invention claimed is:

1. A monolithically integrated multi-junction photovoltaic device comprising a first sub-cell and a second sub-cell in electrical contact with the first sub-cell, the second sub-cell overlying the first sub-cell and arranged such that incident light passes through the second sub-cell to reach the first sub-cell in use, the surface of the second sub-cell having a light receiving surface comprising a layer of a light transmissive electrically conductive material and one or more metal tracks in contact with the layer of light transmissive electrically conductive material and extending in a first direction, a layer of an electrically insulative material is provided on the light receiving surface of the second sub-cell extending under one end of the one or more metal tracks at an edge of the multi-junction cell, and that an electrically conductive pad is provided over the layer of electrically insulative material and in electrical contact with the one or more metal tracks for providing electrical contact to an external circuit, wherein the layer of light transmissive electrically conductive material is not present under at least a portion of the layer of electrically insulative material on the light receiving surface, in which the layer of electrically insulative material on the light receiving surface partly overlaps the layer of light transmissive electrically conductive material.

2. The monolithically integrated multi-junction photovoltaic device as claimed in claim 1, comprising a plurality of metal tracks being spaced apart from each other and extending in the first direction, wherein the electrically insulative material extends in a direction perpendicular to the first direction and plane-parallel with the light-receiving surface.

3. The monolithically integrated multi-junction photovoltaic device as claimed in claim 1 in which the first sub-cell comprises a monocrystalline silicon, polysilicon, CdTe, $Cu(In,Ga)Se_2$ or $Cu_2ZnSn(S,Se)_4$ sub-cell, or a perovskite sub-cell, the first sub-cell having a smaller bandgap than the second sub-cell.

4. The monolithically integrated multi-junction photovoltaic device as claimed in claim 1 in which the electrically insulative material is light transmissive.

5. The monolithically integrated multi-junction photovoltaic device as claimed in claim 1 in which the electrically insulative material is one or more of silicon oxide, silicon oxynitride, silicon nitride, alumina and a cross-linked polymer.

6. The monolithically integrated multi-junction photovoltaic device as claimed in claim 1 in which the electrically insulative material is resilient.

7. The monolithically integrated multi-junction photovoltaic device as claimed in claim 1 in which the electrically insulative material comprises a photo-crosslinked polymer.

8. The monolithically integrated multi-junction photovoltaic device as claimed in claim 1 in which the second sub-cell comprises a layer of a perovskite material.

9. The monolithically integrated multi-junction photovoltaic device as claimed in claim 8 in which the second sub-cell further comprises a layer of hole transporting material and a layer of electron transporting material on either side of the layer of perovskite material.

10. The monolithically integrated multi-junction photovoltaic device as claimed in claim 8 in which the perovskite material comprises one or more cations selected from organic cations and caesium or rubidium cations, one or more of Pb, Sn, or Ti, and one or more halide anions selected from Cl, Br and I.

11. A photovoltaic panel comprising a plurality of the monolithically integrated multi-junction photovoltaic devices as claimed in claim 1 arranged in rows on a substrate and electrically connected in series with one another via said electrically conductive pads.

12. The photovoltaic panel as claimed in claim 11 in which the multi-junction photovoltaic devices are arranged in overlapping rows such that the pad on one device is in contact with the rear contact of an adjacent device.

13. A method of making a monolithically integrated photovoltaic device, the method comprising:
(a) providing a first photovoltaic sub-cell;
(b) providing a second sub cell on top of and in electrical contact with the first sub-cell, the light receiving surface of the second sub-cell comprising a layer of a light transmissive electrically conductive material on the majority of the top surface of the second sub-cell;
(c) providing a layer of an electrically insulative material on a minority of the top surface of the second sub-cell;
(d) providing elongate electrical contacts on the light receiving surface, which contacts extend over both the layer of light transmissive electrically conductive material and the layer of electrically insulative material; and
(e) providing an electrically conductive pad on top of the layer of electrically insulative material and in electrical contact with said elongate electrical contacts, wherein
step (b) is performed so that a region of the light receiving surface does not have a layer of a light transmissive electrically conductive material;
wherein in step (c) the layer of electrically insulative material is provided on said region of the light receiving surface which does not have a layer of a light transmissive electrically conductive material; wherein in step (c) the layer of electrically insulative material is arranged to overlap the edge of the layer of light transmissive electrically conductive material.

\* \* \* \* \*